US012696588B2

US 12,696,588 B2

(12) United States Patent
Peng et al.

(10) Patent No.: US 12,696,588 B2
(45) Date of Patent: Jul. 28, 2026

(54) DISPLAY PANEL, DISPLAY DEVICE, AND FORMING METHOD OF DISPLAY PANEL

(71) Applicant: Hefei Visionox Technology Co., Ltd., Hefei (CN)

(72) Inventors: Chao Chi Peng, Hefei (CN); Xuyang Fang, Hefei (CN); Xiaoling Li, Hefei (CN); Mingxing Liu, Hefei (CN); Shizhen Feng, Hefei (CN); Shuaiyan Gan, Hefei (CN)

(73) Assignee: Hefei Visionox Technology Co., Ltd., Hefei (CN)

( * ) Notice: Subject to any disclaimer, the term of this patent is extended or adjusted under 35 U.S.C. 154(b) by 713 days.

(21) Appl. No.: 17/992,261

(22) Filed: Nov. 22, 2022

(65) Prior Publication Data

US 2023/0089486 A1     Mar. 23, 2023

Related U.S. Application Data

(63) Continuation of application No. PCT/CN2021/138333, filed on Dec. 15, 2021.

(30) Foreign Application Priority Data

Mar. 31, 2021  (CN) .......................... 202110352510.5
Jun. 1, 2021  (CN) .......................... 202110609216.8

(51) Int. Cl.
*H10H 20/831* (2025.01)
*H10H 20/01* (2025.01)
*H10W 90/00* (2026.01)

(52) U.S. Cl.
CPC ........ *H10H 20/8312* (2025.01); *H10H 20/01* (2025.01); *H10W 90/00* (2026.01); *H10H 20/032* (2025.01)

(58) Field of Classification Search
CPC .. H10H 20/8312; H10H 20/01; H10H 20/032; H10H 20/882; H10H 29/142;
(Continued)

(56) References Cited

U.S. PATENT DOCUMENTS

| 2008/0093978 | A1* | 4/2008 | Mori ................... | H10K 50/854 |
| | | | | 313/498 |
| 2008/0164807 | A1 | 7/2008 | Hofmann et al. | |

(Continued)

FOREIGN PATENT DOCUMENTS

| CN | 108596096 A | 9/2018 |
| CN | 109192758 A | 1/2019 |

(Continued)

OTHER PUBLICATIONS

International Search Report issued on Mar. 2, 2022, in corresponding PCT Application No. PCT/CN2021/138333, 6 pages.
(Continued)

*Primary Examiner* — Ratisha Mehta
(74) *Attorney, Agent, or Firm* — Maier & Maier, PLLC

(57) ABSTRACT

A display panel, a display device and a forming method of the display panel. The display panel includes a first region, and the display panel includes: a substrate; a light-emitting device layer stacked on the substrate. The light-emitting device layer includes a plurality of first light-emitting devices distributed in an array in the first region, and the first light-emitting device includes a first electrode, a particle unit disposed at least partially in a same layer with the first electrode and surrounding the first electrode, a first light-emitting module located on the first electrode, and a second electrode located on the first light-emitting module. The particle unit includes a glue layer and a plurality of particles distributed within the glue layer.

20 Claims, 6 Drawing Sheets

(58) Field of Classification Search
CPC .. H10H 20/85; H10H 20/857; H01L 25/0753; H10K 2102/331; H10K 59/879; H10K 59/122; H10K 50/11; H10K 59/8051; H10K 59/8052; H10K 59/8791; H10K 71/00
See application file for complete search history.

(56) References Cited

U.S. PATENT DOCUMENTS

| | | | | |
|---|---|---|---|---|
| 2013/0146903 | A1* | 6/2013 | Ichikawa | H10K 59/122 |
| | | | | 438/34 |
| 2015/0194634 | A1 | 7/2015 | Kang et al. | |
| 2017/0278911 | A1* | 9/2017 | Toyoda | H10H 20/856 |
| 2018/0166519 | A1* | 6/2018 | Kim | H10K 59/122 |
| 2019/0067394 | A1 | 2/2019 | Cheon et al. | |
| 2019/0079340 | A1* | 3/2019 | Cheng | G02F 1/133553 |
| 2020/0243616 | A1* | 7/2020 | Boardman | H10K 50/11 |
| 2020/0319176 | A1* | 10/2020 | Chou | G01N 21/76 |
| 2022/0059050 | A1* | 2/2022 | Thareja | G02F 1/13318 |
| 2022/0204845 | A1* | 6/2022 | Nojima | C09K 11/883 |

FOREIGN PATENT DOCUMENTS

| | | |
|---|---|---|
| CN | 110289284 A | 9/2019 |
| CN | 110600508 A | 12/2019 |
| CN | 110676296 A | 1/2020 |
| EP | 1930965 A1 | 6/2008 |
| JP | 2008511108 A | 4/2008 |
| JP | 2008108439 A | 5/2008 |
| JP | 2011257496 A | 12/2011 |
| JP | 2017040897 A | 2/2017 |
| JP | 2017174774 A | 9/2017 |
| KR | 1020080036520 A | 4/2008 |
| TW | 200829077 A | 7/2008 |
| WO | 2006021202 A1 | 3/2006 |

OTHER PUBLICATIONS

Office Action issued on Mar. 11, 2024, in corresponding Korean Application No. 10-2022-7040736, 17 pages.
Office Action issued on Jun. 24, 2025, in corresponding Chinese Application No. 202110609216.8, 14 pages.
Extended Search Report issued on Nov. 30, 2023, in corresponding European Application No. 21934669.9, 8 pages.
Office Action issued on Nov. 21, 2023, in corresponding Japanese Application No. 2023-515230, 12 pages.
Office Action issued on Jan. 2, 2026, in corresponding European Application No. 21934669.9, 7 pages.

* cited by examiner

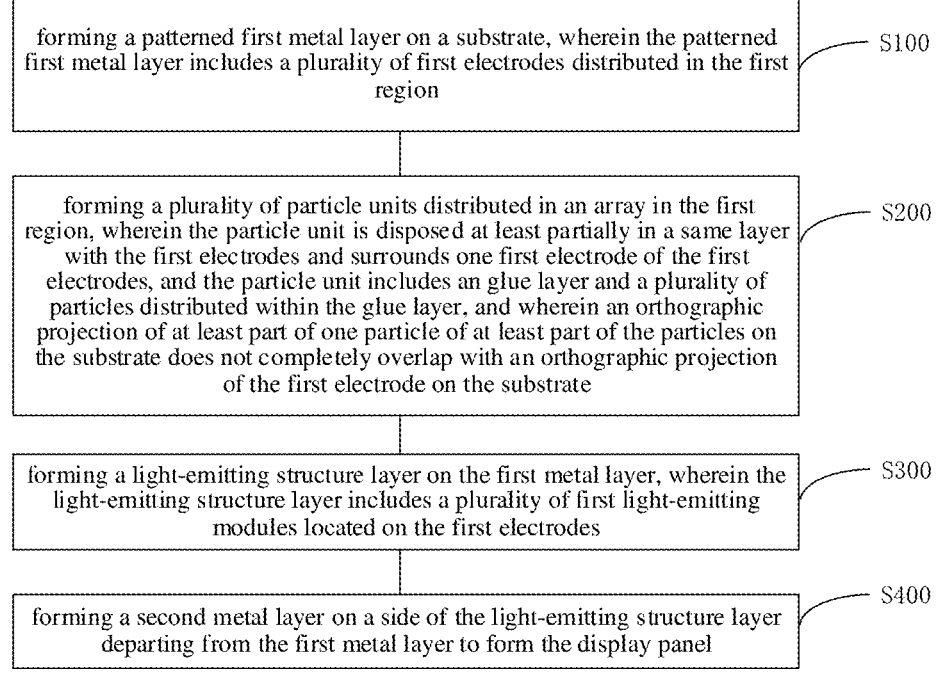

| | |
|---|---|
| forming a patterned first metal layer on a substrate, wherein the patterned first metal layer includes a plurality of first electrodes distributed in the first region | S100 |
| forming a plurality of particle units distributed in an array in the first region, wherein the particle unit is disposed at least partially in a same layer with the first electrodes and surrounds one first electrode of the first electrodes, and the particle unit includes an glue layer and a plurality of particles distributed within the glue layer, and wherein an orthographic projection of at least part of one particle of at least part of the particles on the substrate does not completely overlap with an orthographic projection of the first electrode on the substrate | S200 |
| forming a light-emitting structure layer on the first metal layer, wherein the light-emitting structure layer includes a plurality of first light-emitting modules located on the first electrodes | S300 |
| forming a second metal layer on a side of the light-emitting structure layer departing from the first metal layer to form the display panel | S400 |

Fig. 6

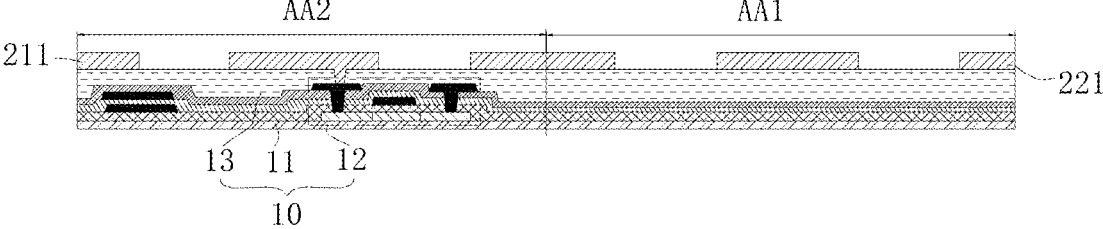

DISPLAY PANEL, DISPLAY DEVICE, AND FORMING METHOD OF DISPLAY PANEL

CROSS-REFERENCE TO RELATED APPLICATIONS

The present application is a continuation of International Application No. PCT/CN2021/138333 filed on Dec. 15, 2021, which claims priority to Chinese patent application No. 202110352510.5, filed on Mar. 31, 2021 and entitled "DISPLAY PANEL, DISPLAY DEVICE, AND FORMING METHOD OF DISPLAY PANEL" and Chinese patent application No. 202110609216.8, filed on Jun. 1, 2021 and entitled "DISPLAY PANEL, DISPLAY DEVICE, AND FORMING METHOD OF DISPLAY PANEL", all of which are hereby incorporated by reference in their entireties.

TECHNICAL FIELD

The present application relates to a technical field of display, and particularly relates to a display panel, a display device and a forming method of the display panel.

BACKGROUND

With the rapid development of electronic devices, users' requirements for screen ratio are getting higher and higher, making the full screen display of the electronic devices attract more and more attention in the industry.

Due to the integration of photosensitive devices such as front cameras, there is a need for the electronic devices such as mobile phones and tablets to increase the light transmittance of the corresponding region. Therefore, more and more manufacturers improve the structure of the region of the display panel corresponding to the devices such as front cameras. To a certain extent, although it can meet the photosensitive needs of the devices such as front cameras, there is also a diffraction phenomenon, which affects the imaging effect of the front cameras.

Thus, there is an urgent need for a new display panel, a new display device and a new display panel forming method.

SUMMARY

The embodiments of the present application provide a display panel, a display device and a forming method of the display panel.

In a first aspect, the embodiments of the present application provide a display panel including a first region, wherein the display panel includes: a substrate; a light-emitting device layer stacked on the substrate, wherein the light-emitting device layer includes a plurality of first light-emitting devices distributed in an array in the first region, and wherein the first light-emitting device includes a first electrode, a particle unit disposed at least partially in a same layer with the first electrode and surrounding the first electrode, a first light-emitting module located on the first electrode, and a second electrode located on the first light-emitting module; wherein the particle unit includes a glue layer and a plurality of particles distributed within the glue layer, an orthographic projection of at least part of one particle of at least part of the particles on the substrate does not completely overlap with an orthographic projection of the first electrode on the substrate.

2

In a second aspect, the embodiments of the present application provide a display device including the display panel described above.

In a third aspect, the embodiments of the present application provide a forming method of the display panel, including: forming a patterned first metal layer on a substrate, wherein the patterned first metal layer includes first electrodes distributed in the first region; forming a plurality of particle units distributed in an array in the first region, wherein the particle unit is disposed at least partially in a same layer with the first electrodes and surrounds one first electrode of the first electrodes, and the particle unit includes a glue layer and a plurality of particles distributed within the glue layer, and wherein an orthographic projection of at least part of one particle of at least part of the particles on the substrate does not completely overlap with an orthographic projection of the first electrode on the substrate; forming a light-emitting structure layer on the first metal layer, wherein the light-emitting structure layer includes first light-emitting modules located on the first electrodes; forming a second metal layer on a side of the light-emitting structure layer departing from the first metal layer to form the display panel.

BRIEF DESCRIPTION OF THE DRAWINGS

The features, advantages, and technical effects of the exemplary embodiments of the present application will be described below with reference to the accompanying drawings.

FIG. 6 is a schematic flowchart of a forming method of the display panel according to an embodiment of the present application;

FIGS. 7 to 11 are schematic structural diagrams corresponding to various steps of the forming method of the display panel according to an embodiment of the present application.

DETAILED DESCRIPTION

The characteristics and exemplary embodiments of the various aspects of the present application will be described in detail below. In order to better clarify the purposes, technical solutions, and advantages of the present application, the present application will be further described in detail in combination with the accompanying drawings and specific embodiments below. It should be understood that the specific embodiments described herein are intended to interpret the present application and are not intended to limit the present application. For those skilled in the art, the present application may be implemented without the need for some details in these specific details. The following description of the embodiments is merely intended to provide a better understanding of the present application by showing examples of the present application.

The full screen display panel is the development trend in the future, but the requirements for the full screen display panel and the design of the front camera have become the main contradiction in the technology. This requires that the optical characteristics of the full screen display panel can support the under display camera function, which is a very high requirement for the optical characteristics of the display panel.

For under display camera (UDC) technology, the photo region should have high-quality imaging characteristics, and at the same time, it also needs to achieve the normal display effect as much as possible. In optical principle, the pattern and the membrane layer structure of the display region will have a strong diffraction on light, which conflicts with the demand of high-quality imaging of the under display camera. How to design a low diffraction screen in the UDC photo region is a major hot issue studied at this stage.

In order to solve the above technical problems, the embodiments of the present application provide a display panel, a display device and a forming method of the display panel. The display panel can meet the requirement for full screen display, while reducing the impact of the diffraction phenomenon on the imaging effect of the devices such as front cameras. In order to provide a better understanding of the present application, the display panel, the display device and the forming method of the display panel provided by the embodiments of the present application will be described in detail in combination with FIGS. 1 to 11.

Figure 1:
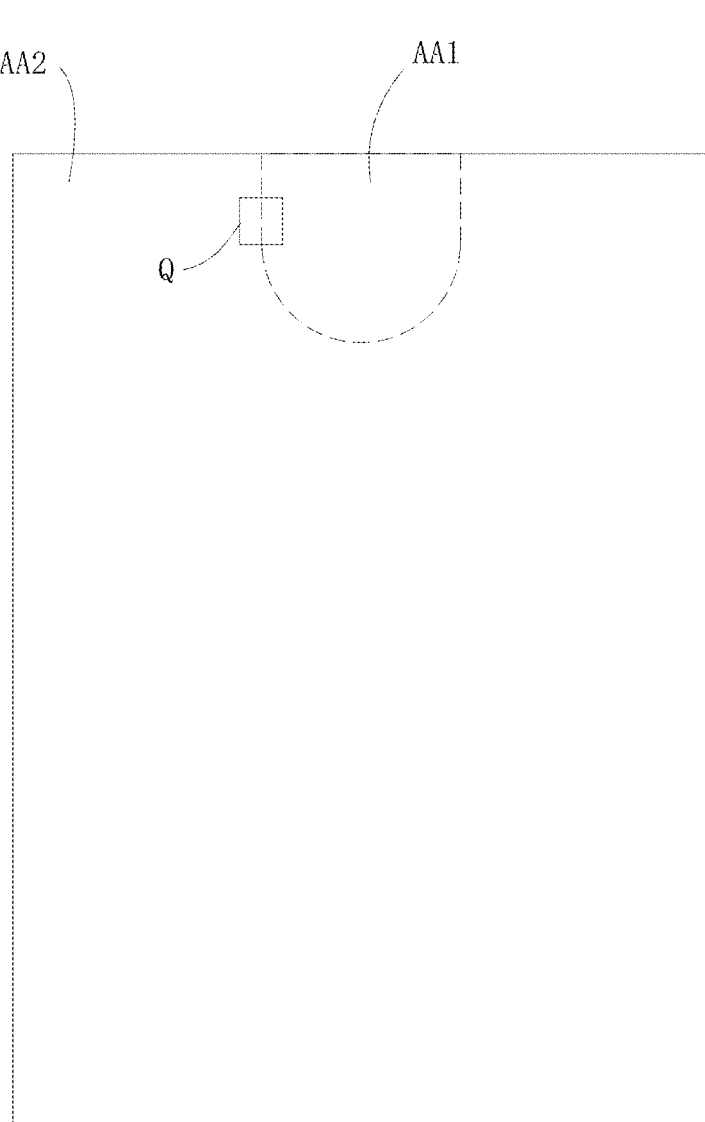
FIG. 1 is a schematic top view of a display panel according to an embodiment of the present application.
Figure 2:
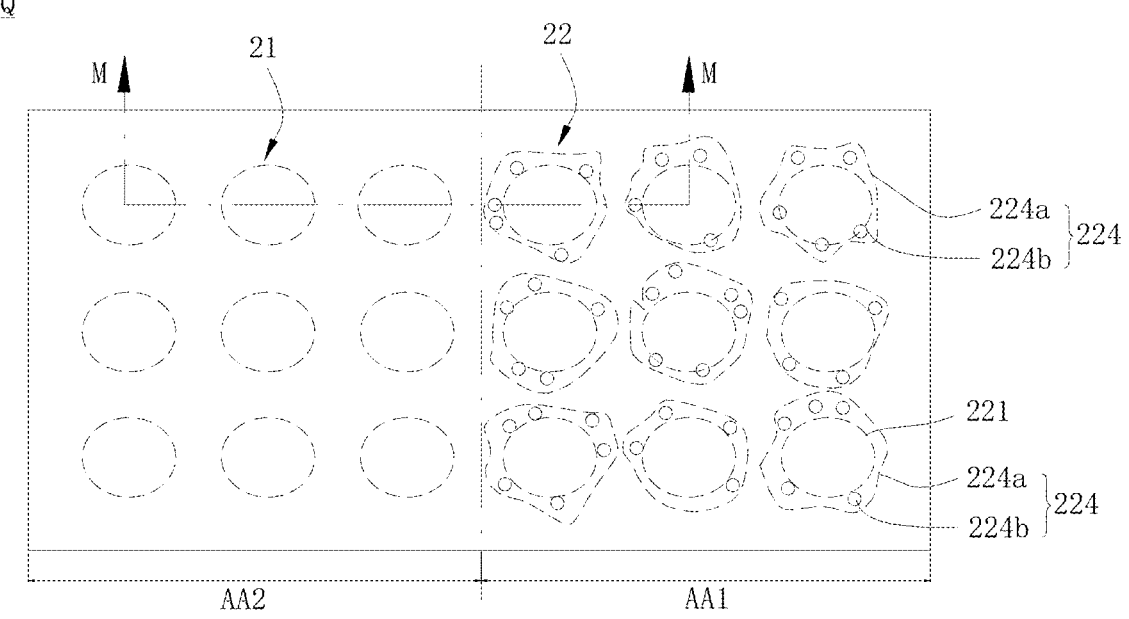
FIG. 2 is a local enlargement view at Q in FIG. 1.
Figure 3:
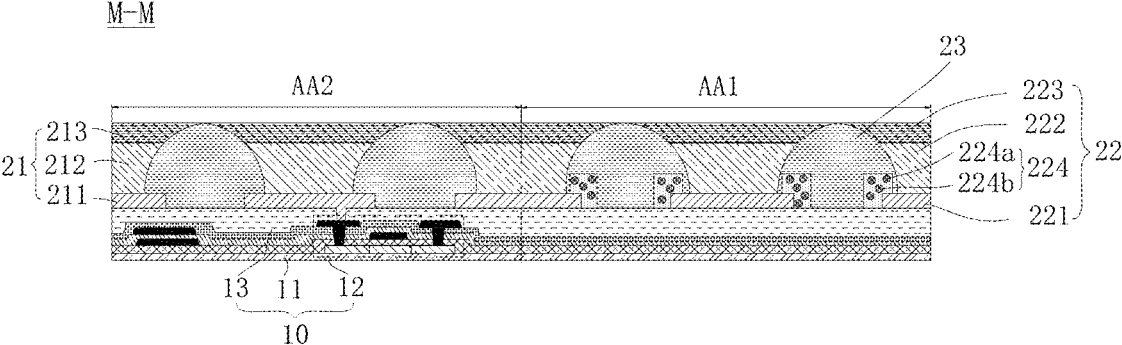
FIG. 3 is a sectional view along the M-M direction in FIG. 2.

As shown in FIGS. 1 to 3, FIG. 1 is a schematic top view of a display panel according to an embodiment of the present application; FIG. 2 is a local enlargement view at Q in FIG. 1; and FIG. 3 is a sectional view along the M-M direction in FIG. 2.

The display panel 1 provided by the embodiments of the present application includes a substrate 10 and a light-emitting device layer 20 stacked on the substrate 10. The display panel 1 has a first region AA1 and a second region AA2 surrounding at least part of the first region AA1. The light-emitting device layer 20 includes a plurality of first light-emitting devices 22 distributed in an array in the first region AA1 and a plurality of second light-emitting devices 21 distributed in an array in the second region AA2. The first light-emitting device 22 includes a first electrode 221, a particle unit 224 disposed at least partially with the first electrode 221 in a same layer and surrounding the first electrode 221, a first light-emitting module 222 located on the first electrode 221, and a second electrode 223 located on the first light-emitting module 222. The second light-emitting device 21 includes a third electrode 211, a second light-emitting module 212 located on the third electrode 211, and a fourth electrode 213 located on the second light-emitting module 212. Here, the particle unit 224 includes a glue layer 224a and a plurality of particles 224b distributed within the glue layer 224a, and an orthographic projection of at least part of one particle of at least part of the particles 224b on the substrate 10 does not completely overlap with an orthographic projection of the first electrode 221 on the substrate 10. That is, the orthographic projection of the particle of at least part of the particles 224b on the substrate 10 may be completely not overlapped with the orthographic projection of the first electrode 221 on the substrate 10. And/or, the orthographic projection of the particle of at least part of the particles 224b on the substrate 10 may be partially overlapped with the orthographic projection of the first electrode 221 on the substrate 10. Alternatively, orthographic projections of at least part of the particles 224b on the substrate 10 are staggered with (i.e., completely not overlapped with) the orthographic projection of the first electrode 221 on the substrate 10.

According to the display panel 1 provided by the embodiments of the present application, the light-emitting device layer 20 includes a plurality of first light-emitting devices 22 distributed in the first region AA1. The first light-emitting device 22 includes a first electrode 221, a first light-emitting module 222 and a second electrode 223, here, the first electrode 221 may be an anode, and the second electrode 223 may be a cathode. With the first light-emitting devices 22 of the first region AA1, the requirements for full screen display of the display panel 1 may be met. Meanwhile, the first light-emitting device 22 further includes a particle unit 224, and the particle unit 224 is disposed at least partially in a same layer with the first electrode 221 and surrounds the first electrode 221. Further, the particle unit 224 includes a glue layer 224a and a plurality of particles 224b distributed within the glue layer 224a, and an orthographic projection of at least part of one particle of at least part of the particles 224b on the substrate 10 does not completely overlap with an orthographic projection of the first electrode 221 on the substrate 10. The particles 224b are randomly distributed around the first electrode 221, and the external light is diffracted, refracted, or reflected at the disordered particles. Thus, the path of the external light is changed, and the diffraction phenomenon caused by the periodic arrangement of the first electrodes is disrupted, thereby reducing the diffraction. Therefore, under a condition that the first region AA1 of the display panel 1 is integrated with a camera device, the impact of the diffraction phenomenon on the imaging effect of the camera device can be reduced, and the imaging effect can be guaranteed.

According to the display panel 1 provided by the embodiments of the present application, the substrate 10 may be an array substrate 10, which includes a substrate 11, thin film transistors 12 distributed in an array on the substrate 11, and a planarization layer 13 covering the thin film transistors 12. The light-emitting device layer 20 may be stacked on the planarization layer 13 of the substrate 10. The thin-film transistors 12 disposed on the substrate 10 can drive the corresponding second light-emitting devices 21 and the first light-emitting devices 22, and thus the display requirements of the display panel can be guaranteed.

Alternatively, the second region AA2 may completely surround the first region AA1, and of course, the second region AA2 may also surround a part of the first region AA1.

As an alternative embodiment, the second light-emitting devices 21 and the first light-emitting devices 22 may be organic light-emitting devices.

According to the display panel 1 provided by the embodiments of the present application, the light-emitting device layer 20 further includes a pixel-defining layer 23 disposed on the substrate 10. Optionally, the pixel-defining layer 23 is located on the planarization layer 13. The adjacent third electrodes 211 are separated by the pixel-defining layer 23; the adjacent first electrodes 221 are separated by the pixel-defining layer 23; and the adjacent first electrode 221 and the third electrode 211 are separated by the pixel-defining layer 23. The pixel-defining layer 23 has pixel openings, and the first electrodes 221 and the third electrode 211 are exposed to the corresponding pixel openings. The first light-emitting modules 222 and the second light-emitting modules 212 are disposed in the corresponding pixel openings in the pixel-defining layer 23. Optionally, in the first region AA1 of the display panel 1, the pixel-defining layer 23 also covers the particle units 224.

Alternatively, the first light-emitting devices 22 are distributed in an array of a first density in the first region AA1 of the display panel 1, and the second light-emitting devices 21 are distributed in an array of a second density in the second region AA2 of the display panel 1, here, the first density is equal to the second density. With the above arrangement, the forming of the light-emitting device layer 20 is facilitated, and the display effect of the display panel 1 can be optimized.

According to the display panel 1 provided by the embodiments of the present application, a number of the particles 224b of the particle unit 224 included in the first light-emitting device 22 is more than one, and distribution patterns of orthographic projections of the more than one particles 224b of particle units 224 included in at least two of the first light-emitting devices 22 are different from each other. With the above arrangement, the structure of the particle unit 224 corresponding to the first light-emitting device 22 can be random. Therefore, by the diffraction, refraction, or reflection of external light at the disordered particles, the diffraction phenomenon caused by the periodic arrangement of the first electrodes is disrupted, and thus the diffraction is reduced.

For example, the number of the particles 224b in the particle unit 224 included in one of the first light-emitting devices 22 of the display panel 1 may be five, and the connected lines of the projections of the five particles 224b on the substrate 10 may form a pentagon. Further, the number of the particles 224b in the particle unit 224 included in another one of the first light-emitting devices 22 of the display panel 1 may be six, and the connected lines of the projections of the six particles 224b on the substrate 10 may form a hexagon. In some embodiments, the distribution patterns of the orthographic projections of the more than one particles 224b of the particle units 224 included the first light-emitting devices 22 of the display panel 1 are different from each other. Thus, the structure of the particle unit 224 corresponding to the first light-emitting device 22 is random. Therefore, by the diffraction, refraction, or reflection of external light at the disordered particles, the path of the external light is changed, the diffraction phenomenon caused by the periodic arrangement of the first electrodes is disrupted, and thus the diffraction is reduced.

In some alternative embodiments, according to the display panel 1 provided by the embodiments of the present application, a difference between numbers of the particles 224b included in at least two of the first light-emitting devices 22 is greater than 0. With the above arrangement, the disorder of the phases of the light passing through the display panel 1 is further guaranteed, and the diffraction is reduced. Therefore, under a condition that the first region AA1 of the display panel 1 is integrated with a front camera device, the diffraction is reduced, and the imaging effect can be guaranteed.

As an alternative embodiment, a ratio of a number of the particles 224b included in the light-emitting device layer 20 to a number of the first light-emitting devices 22 included in the light-emitting device layer 20 is greater than or equal to 50. With the above arrangement, the distribution of the particles 224b in the first region AA1 has enough randomness. Therefore, the disorder of the phases of the light passing through the display panel 1 is effectively guaranteed, and the diffraction problem caused by the light passing through the first region AA1 of the display panel 1 is effectively reduced.

As an alternative embodiment, according to the display panel 1 provided by the embodiments of the present application, an orthographic projection of the particle unit 224 of the first light-emitting device 22 on the substrate 10 protrudes from an orthographic projection of the first electrode 221, which is surrounded by the particle unit 224, on the substrate 10. For example, a size of a part of the orthographic projection of the particle unit 224 on the substrate 10 protrudes from the orthographic projection of the first electrode 221, which is surrounded by the particle unit 224, on the substrate 10 is from 1 μm to 5 μm. The value can be 1 μm and 5 μm, or can be 2 μm, 3 μm, or 4 μm. With the above arrangement, on the premise that the light is passing through between two adjacent first electrodes 221, the distribution area of the particles 224b can be guaranteed, the diffraction can be reduced, and the imaging effect of the integrated camera in the first region AA1 of the display panel 1 can be guaranteed.

It should be noted that, the orthographic projection of the particle unit 224 of the first light-emitting device 22 on the substrate 10 protruding from the orthographic projection of the first electrode 221, which is surrounded by the particle unit 224, on the substrate 10 as mentioned in the embodiments of the present application means that, the particle unit 224 of the first light-emitting device 22 surrounds the four sides of the first electrode 221, the orthographic projection of the particle unit 224 on the substrate 10 surrounds the orthographic projection of the first electrode 221 on the substrate 10, and the orthographic projection of the particle unit 224 on the substrate 10 extends along the extension direction of the substrate 10 in a direction far away from the first electrode 221, so as to protrude out of the orthographic projection of the first electrode 221, which is surrounded by the particle unit 224, on the substrate 10, such that the particle unit 224 is at least partially located in a region between two adjacent first electrodes 221.

As an alternative embodiment, according to the display panel 1 provided by the embodiments of the present application, the particles 224b are high refractive light-pervious particles. Here, the high refractive light-pervious particles are composed of high refractive materials. Specifically, the refractive index of the high refractive materials is greater than 1.8, and further, the refractive index of the high refractive material is 1.8-2.4. The external light is diffracted or refracted at the disordered particles. Specifically, the external light is diffracted at the edge of the particle, and is refracted on the surface of the particle. The path of the external light is changed by utilizing the particles, the diffraction phenomenon caused by the periodic arrangement of the first electrodes is disrupted, and thus the diffraction is reduced.

In some alternative embodiments, according to the display panel 1 provided by the embodiments of the present application, the particles 224b include zirconia particles. Of course, in some embodiments, the particles may also use other high refractive light-pervious particles. As long as the random distribution of the particles can be formed around the first electrode, the diffraction phenomenon caused by the regular arrangement of the first electrodes can be destroyed by the diffraction or refraction of the particles, and the diffraction can be reduced.

As an alternative embodiment, according to the display panel 1 provided by the embodiments of the present application, the particles 224b may be light-impervious particles. The external light is diffracted or reflected at the disordered particles. Specifically, the external light is diffracted at the edge of the particle, and is reflected on the surface of the particle. The diffraction phenomenon caused by the periodic arrangement of the first electrodes is disrupted, and thus the diffraction is reduced.

In some alternative embodiments, according to the display panel 1 provided by the embodiments of the present application, the particles 224b include metal particles, such as aluminum particles. Of course, in some embodiments, the particles may also adopt non-metallic particles, such as carbon particles. As long as the random distribution of the particles can be formed around the first electrode, the diffraction phenomenon caused by the regular arrangement of the first electrodes can be destroyed by the diffraction or reflection of the particles, and the diffraction can be reduced.

As an alternative embodiment, according to the display panel 1 provided by the embodiments of the present application, a diameter value of the particle 224b ranges from 0.1 μm to 1 μm. Specifically, the diameter value of the particle 224b may further range from 0.3 μm to 1 μm. The value can be 0.3 μm and 1 μm, or can be 0.4 μm, 0.6 μm, 0.8 μm, and so on. With the diameter value of the particle 224b having the above range, it can ensure that the path of the light irradiated to the particle 224b is changed, and it can prevent the particle 224b from being too large to block most of the light and affect the imaging effect.

As an alternative embodiment, according to the display panel 1 provided by the embodiments of the present application, the numbers and sizes of the particles 224b in the particle units 224 included in the first light-emitting devices 22 may be different.

In some alternative embodiments, according to the display panel 1 provided by the embodiments of the present application, under a condition that the particle unit 224 is a non-conductive structure layer, the particle units 224 of the plurality of first light-emitting devices 22 may be disposed in a same layer and connected to each other. Of cause, it is an alternative embodiment. Further, in some embodiments, the particle units 224 of two adjacent first light-emitting devices 22 may be arranged at intervals with each other. With the above arrangement, regardless of whether or not the particle 224b is a conductive particle, it can effectively avoid the electrical connection between the first electrodes 221 caused by the setting of particle units 224, thereby ensuring the display effect.

In some alternative embodiments, the particle unit 224 may at least partially cover the surface of the first electrode 221 departing from the substrate, thereby facilitating the surrounding of the particle unit 224 to the first electrode 221 and reducing the diffraction probability.

Alternatively, according to the display panel 1 provided by the embodiments of the present application, the third electrodes 211 and the first electrodes 221 of the display panel 1 may be disposed in a same layer, and may be independently arranged at intervals with each other. Optionally, the third electrodes 211 and the first electrodes 221 are all anodes. Alternatively, the fourth electrodes 213 and the second electrodes 223 of the display panel 1 may be disposed in a same layer, and the fourth electrodes 213 and the second electrodes 223 are all cathodes. Optionally, the fourth electrodes 213 and the second electrodes 223 may be an integrated structure, and may be disposed in a whole layer.

As an alternative embodiment, according to the display panel 1 provided by the embodiments of the present application, the first region AA1 of the display panel 1 may be a first display region, and the second region AA2 of the display panel 1 may be a second display region. The first display region and the second display region jointly realize the full screen display requirements of the display panel 1.

Figure 4:
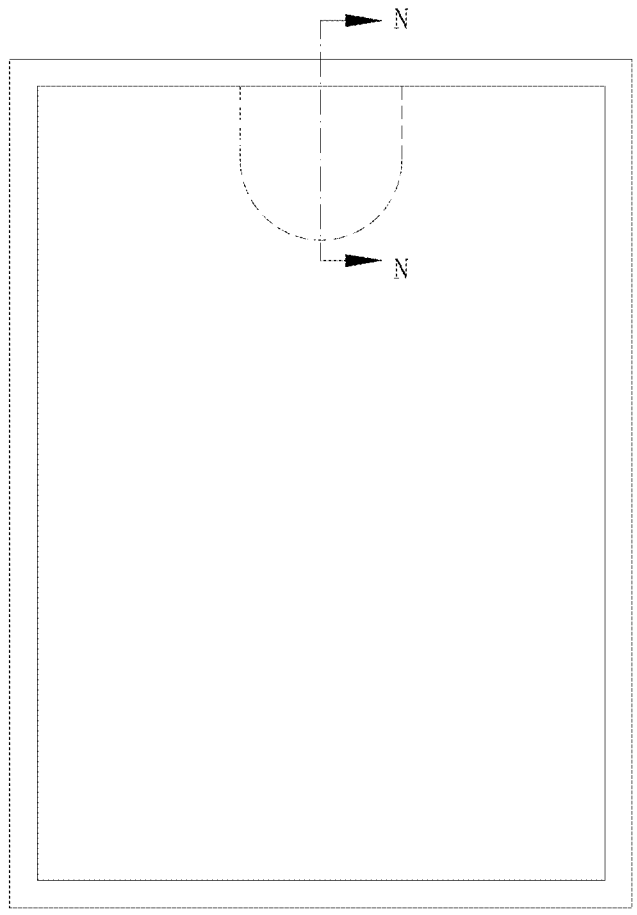
FIG. 4 is a schematic structural diagram of a display device according to an embodiment of the present application.
Figure 5:
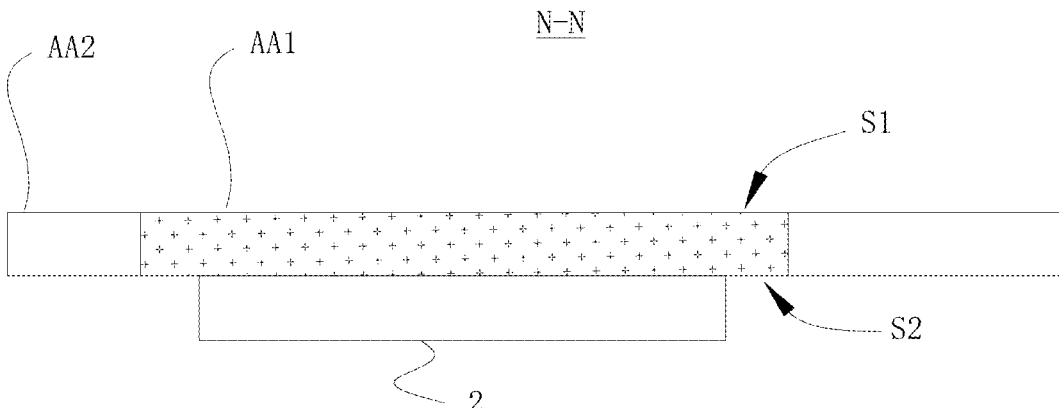
FIG. 5 is a sectional view along the N-N direction in FIG. 4.
Figure 8:
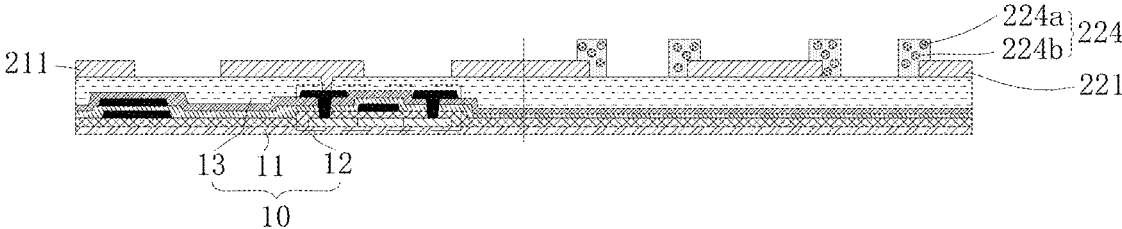
Figure 9:
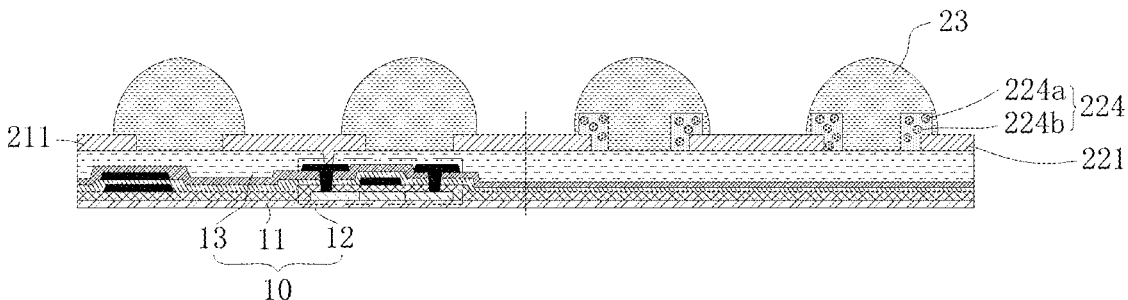
Figure 10:
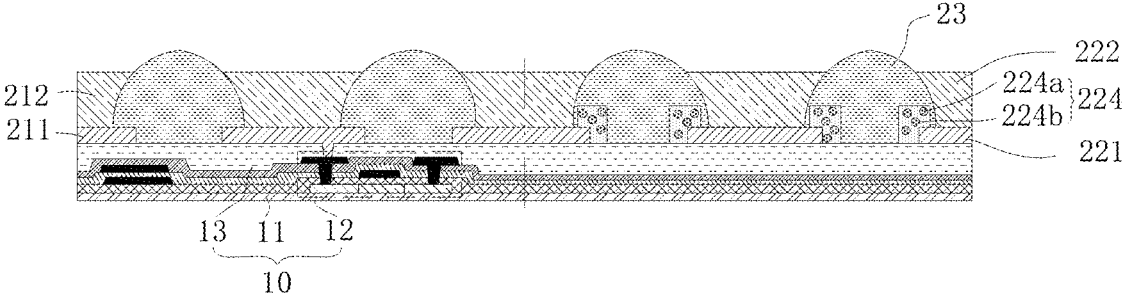
Figure 11:
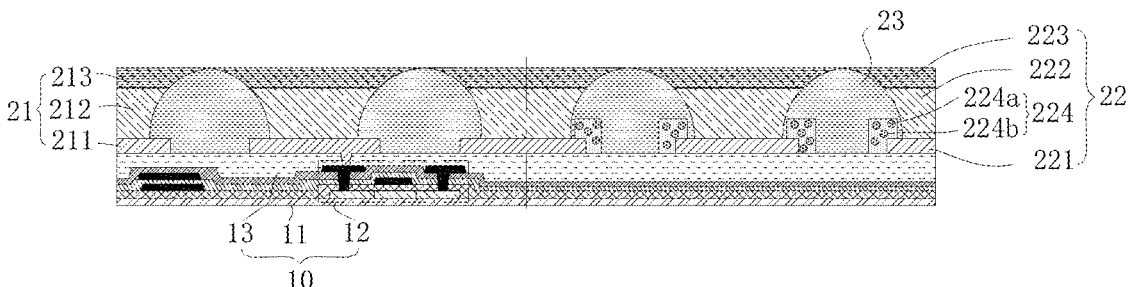

As shown in FIGS. 4 and 5, FIG. 4 is a schematic structural diagram of a display device according to an embodiment of the present application, and FIG. 5 is a sectional view along the N-N direction in FIG. 4. On the other hand, the embodiments of the present application further provide a display device, including the display panel 1 described in the above embodiments. The display panel 1 includes a first surface S1 and a second surface S2 disposed oppositely, wherein the first surface S1 is a display surface. The display device further includes a photosensitive component 2 located on a side of the second surface S2 of the display panel 11, and the photosensitive component 2 corresponds to the position of the first region AA1.

The photosensitive component may be an image acquisition device for collecting external image information. In this embodiment, the photosensitive component may be a Complementary Metal Oxide Semiconductor (CMOS) image acquisition device, and in other embodiments, the photosensitive component may also be an image acquisition device such as a Charge-coupled Device (CCD) image acquisition device, such as a front camera.

As shown in FIGS. 6 to 11, FIG. 6 is a schematic flowchart of a forming method of the display panel 1 according to an embodiment of the present application, and FIGS. 7 to 11 are schematic structural diagrams corresponding to various steps of the forming method of the display panel 1 according to an embodiment of the present application. On another aspect, the embodiments of the present application also provide a forming method of the display panel 1, wherein the method includes:

S100, forming a patterned first metal layer on a substrate 10, wherein the patterned first metal layer includes first electrodes 221 distributed in the first region AA1 of the display panel 1;

S200, forming a plurality of particle units 224 distributed in an array in the first region AA1, wherein the particle unit 224 is disposed at least partially in a same layer with the first electrodes 221 and surrounds one first electrode 221 of the first electrodes 221, and the particle unit 224 includes an glue layer 224a and a plurality of particles 224b distributed within the glue layer 224a, and wherein an orthographic projection of at least part of one particle of at least part of the particles 224b on the substrate 10 does not completely overlap with an orthographic projection of the first electrode 221 on the substrate 10;

S300, forming a light-emitting structure layer on the first metal layer, wherein the light-emitting structure layer includes first light-emitting modules 222 located on the first electrodes 221;

S400, forming a second metal layer on a side of the light-emitting structure layer departing from the first metal layer to form the display panel 1, wherein the second metal layer includes second electrodes 223 located on the first light-emitting modules 222.

According to the forming method of the display panel 1 provided by the embodiments of the present application, the display panel 1 provided by the above embodiments may be formed. The display panel 1 includes a plurality of particle units 224 distributed in an array in the first region AA1, and the particle unit 224 is disposed at least partially in a same layer with the first electrode 221 and surrounds one first electrode 221 of the first electrodes 221. Further, the particle unit 224 includes a glue layer 224a and a plurality of particles 224b distributed within the glue layer 224a, and an orthographic projection of at least part of one particle of at least part of the particles 224b on the substrate 10 does not completely overlap with an orthographic projection of the first electrode 221 on the substrate 10. Therefore, the formed display panel 1 has particles 224b in the corresponding first region AA1. The particles 224b are randomly distributed around the first electrode 221, and the external light is diffracted, refracted, or reflected at the disordered particles. Thus, the path of the external light is changed, and the diffraction phenomenon caused by the periodic arrangement of the first electrodes is disrupted, thereby reducing the diffraction. Therefore, under a condition that the first region AA1 of the display panel 1 is integrated with a camera device, the impact of the diffraction phenomenon on the imaging effect of the camera device can be reduced, and the imaging effect can be guaranteed.

As an alternative embodiment, in step S100, the provided substrate 10 may be the array substrate 10 mentioned in the display panel 1 in the above embodiments. The substrate 10 may be fabricated in advance, or may certainly be field prefabricated prior to step S100, which is not limited here.

Optionally, in step S100, the patterned first metal layer further includes third electrodes 211 distributed in the second region AA2 of the display panel 1.

In some alternative embodiments, the step S200 may include:

coating a glue solution mixed with the particles 224b in the first region AA1 and solidifying to form the glue layer;

patterning the glue layer to form the plurality of particle units 224 distributed in an array.

Alternatively, the step of patterning the glue layer to form the plurality of particle units 224 distributed in an array may patterning the glue layer using an etching process, thereby ensuring the array distribution requirements of the plurality of particle units 224 distributed in an array.

In some alternative embodiments, in step S300, the formed light-emitting structure layer further includes second light-emitting modules 212 located on the third electrodes 211.

Although the present application has been described with reference to the preferred embodiments, various improvements may be made and the components may be replaced with an equivalent without departing from the scope of the present application. In particular, the technical features mentioned in the various embodiments can be combined in any manner as long as there is no structural conflict. The present application is not limited to the particular embodiments disclosed herein, but rather includes all technical solutions that fall within the scope of the claims.

What is claimed is:

1. A display panel including a first region, wherein the display panel comprises:

a substrate;

a light-emitting device layer stacked on the substrate, wherein the light-emitting device layer comprises a pixel-defining layer disposed on the substrate and a plurality of first light-emitting devices distributed in an array in the first region, and wherein the first light-emitting device comprises:

a first electrode, a particle unit disposed at least partially in a same layer with the first electrode and surrounding the first electrode, a first light-emitting module located on the first electrode, and a second electrode located on the first light-emitting module and the pixel-defining layer covers the particle unit;

wherein:

the particle unit comprises a glue layer and a plurality of particles distributed within the glue layer, an orthographic projection of at least part of one particle of at least part of the particles on the substrate does not completely overlap with an orthographic projection of the first electrode on the substrate, the thickness of the particle unit is less than the thickness of the pixel-defining layer, the particle unit is L-shaped, and a cross-section of the pixel-defining layer is an upwardly protruding semi-circle surrounding two particle units at opposite corners.

2. The display panel according to claim 1, wherein orthographic projections of at least part of the particles on the substrate are staggered with the orthographic projection of the first electrode on the substrate.

3. The display panel according to claim 1, wherein distribution patterns of orthographic projections of the plurality of particles of particle units included in at least two of the first light-emitting devices are different from each other.

4. The display panel according to claim 1, wherein a difference between numbers of the particles included in at least two of the first light-emitting devices is greater than 0.

5. The display panel according to claim 1, wherein a ratio of a number of the particles included in the light-emitting device layer to a number of the first light-emitting devices is greater than or equal to 50.

6. The display panel according to claim 1, wherein an orthographic projection of the particle unit of the first light-emitting device on the substrate protrudes from an orthographic projection of the first electrode, which is surrounded by the particle unit, on the substrate.

7. The display panel according to claim 6, wherein a size of a part of the orthographic projection of the particle unit on the substrate protrudes from the orthographic projection of the first electrode, which is surrounded by the particle unit, on the substrate is from 1 μm to 5 μm.

8. The display panel according to claim 1, wherein the particles are high refractive light-pervious particles.

9. The display panel according to claim 8, wherein the high refractive light-pervious particles comprise zirconia particles.

10. The display panel according to claim 1, wherein the particles are light-impervious particles.

11. The display panel according to claim 1, wherein the particles comprise metal particles.

12. The display panel according to claim 1, wherein the particles comprise carbon particles.

13. The display panel according to claim 1, wherein a diameter value of the particle ranges from 0.1 μm to 1 μm.

14. The display panel according to claim 1, wherein particle units of two adjacent first light-emitting devices are arranged at intervals with each other.

15. The display panel according to claim 1, wherein the display panel further includes a second region surrounding at least part of the first region, the light-emitting device layer further comprises a plurality of second light-emitting devices distributed in an array in the second region, and wherein the second light-emitting device comprises a third electrode, a second light-emitting module located on the third electrode, and a fourth electrode located on the second light-emitting module.

16. The display panel according to claim 15, wherein the first light-emitting devices are distributed in an array of a first density in the first region, and the second light-emitting devices are distributed in an array of a second density in the second region.

17. The display panel according to claim 16, wherein the first density is equal to the second density.

18. A display device comprising a display panel including a first region, wherein the display panel comprises:

a substrate;

a light-emitting device layer stacked on the substrate, wherein the light-emitting device layer comprises a pixel-defining layer disposed on the substrate and a plurality of first light-emitting devices distributed in an array in the first region, and wherein the first light-emitting device comprises:

a first electrode, a particle unit disposed at least partially in a same layer with the first electrode and surrounding the first electrode, a first light-emitting module located on the first electrode, and a second electrode located on the first light-emitting module and the pixel-defining layer covers the particle unit;

wherein:

the particle unit comprises a glue layer and a plurality of particles distributed within the glue layer, an orthographic projection of at least part of one particle of at least part of the particles on the substrate does not completely overlap with an orthographic projection of the first electrode on the substrate, the thickness of the particle unit is less than the thickness of the pixel-defining layer, the particle unit is L-shaped, and a cross-section of the pixel-defining layer is an upwardly protruding semi-circle surrounding two particle units at opposite corners.

19. The display panel according to claim 1, wherein an orthographic projection of the glue layer on the substrate overlaps with the orthographic projection of the first electrode on the substrate.

20. The display panel according to claim 1, wherein two adjacent particle units of two adjacent light-emitting devices are located within a same pixel-defining layer.

\* \* \* \* \*